United States Patent [19]

Waters

[11] 4,149,268
[45] Apr. 10, 1979

[54] DUAL FUNCTION MEMORY

[75] Inventor: Ronald S. Waters, Melbourne Beach, Fla.

[73] Assignee: Harris Corporation, Cleveland, Ohio

[21] Appl. No.: 823,070

[22] Filed: Aug. 9, 1977

[51] Int. Cl.² .................. G11C 11/40; G11C 17/00
[52] U.S. Cl. ................................. 365/95; 307/279; 365/156
[58] Field of Search ............... 365/95, 155, 156, 94, 365/154; 307/238, 279, DIG. 3

[56] References Cited

U.S. PATENT DOCUMENTS

| | | | |
|---|---|---|---|
| 3,493,786 | 2/1970 | Ahrons et al. | 307/279 |
| 3,636,530 | 1/1972 | Mark et al. | 307/238 X |
| 3,798,621 | 3/1974 | Baitinger et al. | 307/238 X |
| 3,868,656 | 2/1975 | Stein et al. | 307/279 X |
| 3,959,781 | 5/1976 | Mehta et al. | 307/DIG. 3 |
| 3,971,004 | 7/1976 | Dingwall | 365/156 |
| 4,035,784 | 7/1977 | Brown | 307/279 |

OTHER PUBLICATIONS

Ho et al., "Programmable Memory Circuits", IBM Tech. Disc. Bull., vol. 17, No. 11, 4/75, p. 3279.
Balasubramanian et al., "Monolithic Storage Cell having Inherent Latent Image Memory Operation", IBM Tech. Disc. Bull., vol. 17, No. 12, 5/75, pp. 3634-3635.

Primary Examiner—Terrell W. Fears
Assistant Examiner—Donald McElheny, Jr.
Attorney, Agent, or Firm—Leitner, Palan, Martin & Bernstein

[57] ABSTRACT

An unbalanced bistable, memory cell operable as a read/write and read only memory having a first switch for disconnecting the cell from a power supply and a second switch for interconnecting the information storage nodes in response to a power down signal to discharge the nodes and allow the memory cell to store a preselected bit of information determined by the unbalance after reconnection of the power supply and disconnection of the nodes upon the absence of the power down signal.

17 Claims, 5 Drawing Figures

DUAL FUNCTION MEMORY

BACKGROUND OF THE INVENTION

The present invention relates generally to memory cells and more particularly to a memory cell capable of operation in a read/write and a read only memory configuration.

Many process oriented control applications in todays industries are using low cost micro-controllers. Such systems require a limited amount of memory. Most applications require the incorporation of both pre-programmed memories and real time read/write memories. A predetermined sequence of events or programs are stored in non-volatile or preprogrammed memories while data relevant to a particular point in time or alterable information is stored in programmable memories. Because of a limited amount of memory available, memories capable of operation as non-volatile memories and programmable memories were developed.

Prior art dual functional memories included extensive metal paths and switches to preselect the state of the memory cell upon powering up the memory system. These systems generally occupied large amount of surface area in an integrated circuit and are thus considered undesirable. Other devices having included placing a diode on a desired information node of a memory cell and powering the diode to pre-store the desired information bit.

Unbalanced bistable memory cells are also wellknown in the prior art having, for example, unbalanced capacitors or resistors connected to a respective information node of a memory cell. Some of these systems require a three level voltage supply wherein the memory cell operates as a non-volatile memory upon transition from a first to a third level and operates as a programmable memory upon transition from a second to a third level. The second voltage level is generally a maintenance level to prevent the unbalance memory cell from assuming the non-volatile state. The voltages are applied along the usual supply line throughout the memory system.

SUMMARY OF THE INVENTION

The present invention provides a new and improved dual function memory wherein a first switch interconnects the power supply and the unbalanced bistable memory cell and a second switch interconnects the two information storage nodes so as to completely discharge or erase the information stored in the nodes upon a power down signal. A preselected bit is stored in the memory cell as determined by the impedance unbalance of the memory cell. The unbalanced bistable memory cell could include a cross-coupled pair of complementary field effect transistor inverters. The first switch means would be a P channel device interconnecting the P channel devices of the inverters to the power supply and the second switch means would be an N channel device interconnecting the information storage nodes. The signal source would provide a power down signal to the P channel switch to remove the power from the memory cell and to the N channel device to interconnect the information storage nodes and allow the stored information or charge to be discharged to ground. In the absence of the power down signal, the P channel device interconnects the power supply and the crosscoupled inverters and the N channel device disconnects the information nodes allowing the memory to store information at its nodes. The unbalanced bistable memory may also be configured using other field effect transistors as well as bipolar transistors. A first and second switching means would be appropriately selected switches so as to perform a function to disconnect the power for a power down signal and to provide a discharge or erasing function of the information nodes in response to the power down signal and to allow normal operation of the memory cell after the power up and assuming a preselected state. The unbalanced bistable memory cell may comprise a portion or all of a memory matrix. The first and second switching means may be used with any or all of the unbalanced bistable memory cells in the matrix to control their dual function.

OBJECTS OF THE INVENTION

An object of the present invention is to provide a memory capable of functioning as a non-volatile memory and a programmable read/write memory.

Another object is to provide a new approach of effectuating a dual function memory.

A further object of the invention is to provide an integrated memory matrix having cells therein capable of dual memory function using a minimum amount of surface area to effectuate the dual functions.

Still another object of the present invention is to provide switches capable of reverting selected memory cells in a memory to the ROM state without interfering with the power or connection of the power supply to other memory cells in the memory matrix.

Other objects, advantages and novel features of the present invention will become apparent from the following detailed description of the invention when considered in conjunction with the accompanying drawings.

BRIEF DESCRIPTION OF THE DRAWINGS

FIG. 1 illustrates a static six transistor memory cell 10 of an unbalanced configuration. P channel and N channel field effect transistors 12 and 14 form a CMOS inverter and is cross-coupled to a P channel and N channel device 16 and 18 respectively which is a second CMOS inverter. Interconnecting information storage node 20 and the DATA line 22 is FET switch 24 and interconnecting information storage node 26 and DATA line 28 is FET switch 30. The gates of the FET switches 24 and 30 are connected to the row select line 32. The just described six transistor configuration is well-known in the prior art and is not considered part of this invention. It is also well known to configure the field effect transistors 12, 14, 16, or 18 such that the cell is unbalanced, i.e., that the impedance of one section of the memory cell is different from the impedance of the second section of the memory cell such that the cell will assume a predetermined state upon being powered up.

Figure 1:
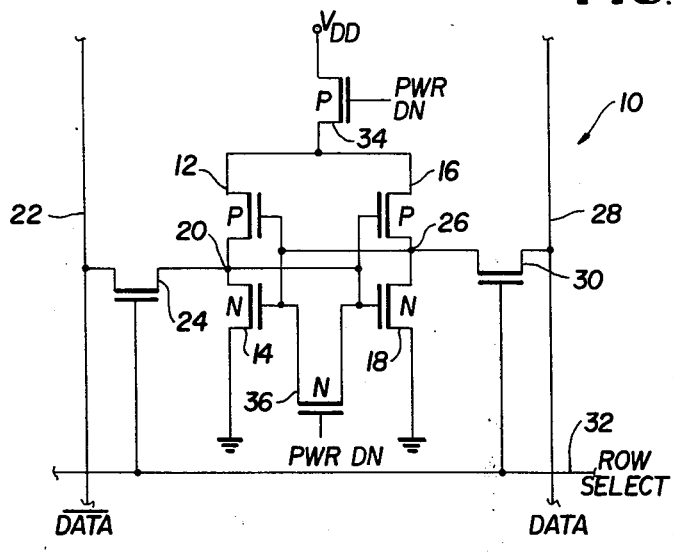
FIG. 1 is a schematic diagram of a complementary field effect transistor memory cell embodying the concept of the present invention.

This unbalanced configuration may be produced by the geometry of individual devices, for example, the size of the channel region, or by the gate material to produce parasitic capacitors of different capacitance or resistors of different resistive levels. The specific form or means to produce the unbalance is not critical to this invention as long as the unbalance is produced.

A P channel field effect transistor 34 interconnects the P channel devices 12 and 16 of the memory cell to the power supply $V_{DD}$ and its gate is driven by the power down signal (PWR DN). FET 36 interconnects the information storage nodes 20 and 26 and its gate is also driven by the power down signal (PWR DN). Although the switch 34 and 36 are illustrated as complementary depletion type field effect transistors, and the power down signal is applied to their gates in the appropriate fashion, other field effect transistors and other switching devices may be used, the essence being the operation of the switching devices, to produce the required functions.

The operation of the dual function memory cell 10 begins with a power down signal applied to the gate of FET 34. This signal turns off FET 34 and removes or isolates the power supply from the memory cell. Simultaneously the two storage nodes 20 and 26 will be tied together and discharged through ground via the conduction of FET switch 36 which also receives the power down signal. Thus switches 34 and 36 have removed the power from the inverter and discharged or erased the information or signal stored at information storage modes 20 and 26 and basically reset the bistable memory cell 10. When the cell is powered up, the power down signal is removed from the gate of transistor switch 34 allowing it to conduct and thereby interconnecting the power supply $V_{DD}$ and the memory cell 10. The absence of the power down signal at the gate of FET switch 36 causing it to cease conduction and thus removing the short or tie of the information storage nodes 20 and 26 allowing a signal or bit of information to be stored at one or the other of the storage nodes 20 or 26.

Since the ratio of the devices 12, 14, 16 and 18, produce an unbalance a preselected bit of information is stored at node 20 or 26 based on this ratioing upon resumption of the power. Thus, upon a power up signal, the dual function memory cell 10 function as a preprogrammed read only memory (ROM). After use of the programmed information contained in the memory cell 10, the cell can be used for data storage and can be written into like a static random access memory (RAM) cell. Thus, by the addition of two switching elements 34 and 36, a standard six static bistable memory cell can selectively function as a read only memory as well as a read/write memory.

Figure 2:
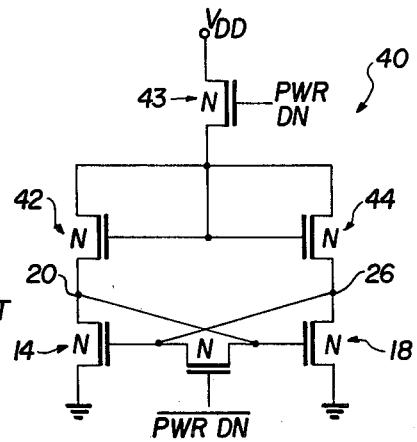
FIG. 2 is a schematic diagram of a field effect transistor memory cell also embodying the concept of the present invention having enhancement load devices.

Although FIG. 1 illustrates a memory cell 10 using a CMOS implementation, other implementations can be provided using the concept of the present invention. For example, in FIGS. 2 and 3 a bistable unbalanced memory cell 40 is illustrated as including cross-coupled N channel devices 14 and 18 similar to the memory cell 10 and N channel load devices 42 and 44. A N channel FET 43 interconnects the power supply $V_{DD}$ and the memory cell 40 similar to FIG. 1 and the N channel FET 36 interconnects the information storage nodes 20 and 26 as in FIG. 1. The operation of the memory cell 40 in FIG. 2 with the first and second switching elements 34 and 36 is identical to that of memory cell 10 in FIG. 1. Namely, it includes an unbalanced bistable memory cell functioning in response to power down signals to disconnect the power supply and erase or discharge information stored at the information storage nodes 20 and 26 so as to allow the nodes to store a preselected bit of information upon reenergization or removal of the power down signal. FIG. 2 is an implementation using enhancement load FETS 42, 44 and FIG. 3 using depletion load FETS 42, 44. Since both implementations use N channel FETS, the node FET is driven by the inverse of the power down signal (PWR DN).

Figure 4:
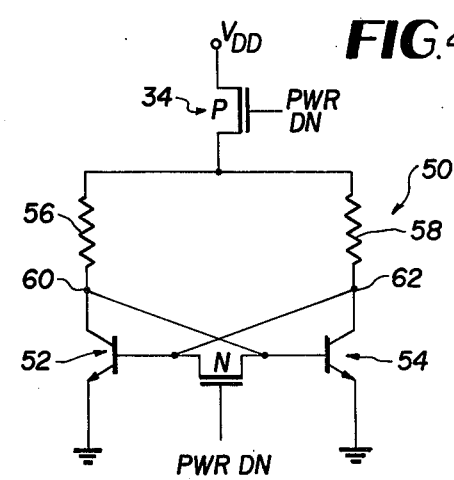
FIG. 4 is a schematic diagram of a bipolar memory cell embodying the concept of the present invention.

FIG. 4 shows a bipolar memory cell 50 including transistors 52, 54, and load resistors 56 and 58. The transistors are connected in a cross-coupled manner and the geometry of the transistors and/or resistors are such that memory cell 50 is an unbalanced bistable memory cell. The first FET switching element 34 interconnects the load resistors 56 and 58 and the power supply of V and the second switching FET interconnects the information storage nodes 60 and 62. The bipolar transistor memory cell 50 with the FET switching elements operates in the same way as the memory cells 10 and 40 of FIGS. 1 and 2 respectively.

The concept of the present invention may be applied to a memory matrix or array including a plurality of bistable memory cells. Each of the memory cells of the matrix may be, or some may be, dual function devices depending on the design criteria and memory space limitation.

Figure 5:
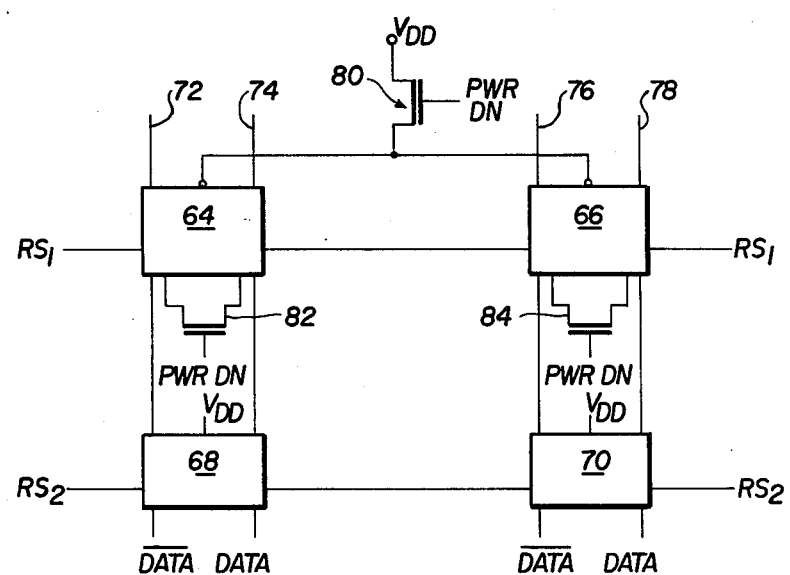
FIG. 5 is a schematic diagram of a memory matrix embodying the concept of the present invention.

FIG. 5 illustrates a four memory cell matrix including a memory cell 64, 66, in row 1 and 68 and 70 in row 2. Row 1 is driven by or interconnected by a row select line RS1 and row 2 is interconnected by row select line RS2. DATA line 72 and DATA line 74 interconnecting memory cells 64 and 68 and DATA line 76 and DATA line 78 interconnect memory cells 66 and 70. Memory cells 64 and 66 are unbalanced bistable memory cells and 68 and 70 may be but do not have to be unbalanced bistable memory cells. A first switching device or P channel FET 80 (which may also be N channel depending upon cell structure) interconnects the unbalanced bistable memory cells 64 and 66 to the power supply $V_{DD}$ and a second switching device or N channel device 82 and 84 are connected across the information storage nodes of the memory cells 64 and 66 respectively.

Figure 3:
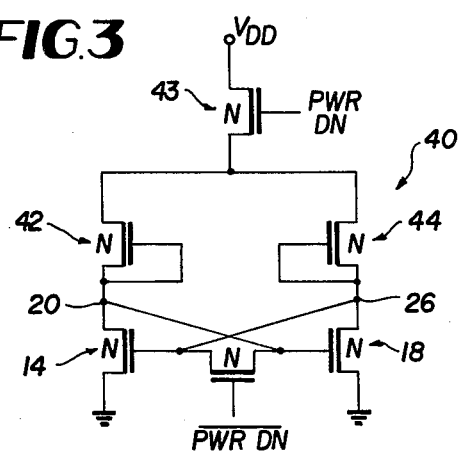
FIG. 3 is a schematic diagram of a field effect transistor memory cell also embodying the concept of the present invention having depletion load devices.

The switching devices 80, 82, and 84 operate in relationship to the individual memory cells 64 and 66 as described for FIGS. 1-3. By using a single switching device 80 for plurality of cells, the amount of space used to effectuate the dual function memory is reduced. Also individual control of the dual function cells may be provided whereas prior art memory cells performing a dual function require power down of the entire memory matrix in order to effectuate the preprogrammed read only memory functions. By using switching elements 80, 82, and 84 these elements need only be switched by the power down signal PWR DN to selectively power down the individual memory cells 64 and 66 causing erasure or removal of the bits of information at the storage nodes while allowing memory cell 68 and 70 to retain their written information.

For applications requiring frequent referencing of the read preprogrammed or read only data, the following sequence of operation is proposed. The bit or byte stored in the dual function memories 64 and 66, are read and stored in registers. Next, the common switch 80 and switches 82 and 84 are controlled by the power down signal so as to disconnect the power from the memory cells and discharge or erase the data or information stored therein. Next, the power down signal is removed from switches 80 and 82 and 84 reenergization cell 64 and 66 causing them to assume a preselected state due to the unbalance of the memory cell. The preselected data or information is then read from the cells and used as required. After the preselected data is read, the data in the registers are then rewritten into the cell 64 and 66 and the memory matrix is thus returned to its last written state prior to the power-down, power-up sequence for the selected cells.

Thus it can be seen that selective deactivation or selective operation of dual function memory cells in their read only memory function may be effected without totally powering down and powering up the memory matrix. By providing switches 80, 82, and 84 in each memory cell, the individual cells may be selectively operated as dual function memories.

From the preceding description of the preferred embodiments, it can be seen that the objects of the invention are obtained and a novel dual function memory is provided. Although the invention has been described and illustrated in detail, it is to be clearly understood that the same is by way of illustration and example only and is not to be taken by way of limitation. The spirit and scope of this invention is to be limited only by the terms of the appended claims.

What is claimed:

1. A method for causing a single unbalanced bistable memory cell having storage nodes, said unbalanced memory cell including a pair of cross-coupled transistor inverters, said inverters having unequal impedances such that upon application of power to said unbalanced cell they assume a predetermined one of two stable states determined by the impedance characteristics of the cell inverters, and powered by a power supply to function both as a read only and a read/write memory comprising the steps of:
    discharging said storage nodes when said power supply is disconnected from said cell;
    reconnecting said power supply to said cell while preventing further discharge of said nodes to cause said cell to assume one of its two stable states determined by the unbalance of said cell; and
    causing said cell to assume either of its stable states in response to a write command irrespective of the state determined by the cell unbalanced.

2. In a bistable memory cell including a pair of cross-coupled transistor inverters each inverter having a storage node, said inverters being structured to have impedances such that upon application of power to said cell it assumes a predetermined one of two stable states determined by the impedance characteristics of the inverters, the improvement comprising:
    a first switch means for interconnecting the memory cell and a power supply;
    a second switch means for interconnecting the two storage nodes of the memory cell; and
    signaling means for providing a power down signal and the complement of the power down signal, said power down signal being applied to said first switching means simultaneously with the application of the complement of the power down signal to the second switching means to disconnect said memory cell from said power supply while the storage nodes of the memory cell are electrically interconnected, said power down signal being applied to said second switch means while the complement of said power down signal is applied to said first switch means to electrically connect said memory cell to said power supply while said storage nodes are electrically disconnected from each other.

3. The bistable memory cell according to claim 2 wherein said cross-coupled transistor inverters are comprised of bi-polar transistors.

4. In a bistable memory cell according to claim 2 wherein said cross-coupled transistor inverters are comprised of field effect transistors and said first switch means is a P channel device interconnecting the inverters to said power supply and said second switch is an N channel device interconnecting said storage nodes.

5. In a bistable memory cell of the unbalanced impedance type, said cell being powered by a power supply, information being stored in said memory cell at storage nodes, the improvement comprising:
    first switch means for interconnecting the memory cell and said power supply;
    a second switch means for interconnecting said storage nodes to cause said storage nodes to discharge the information stored therein when said nodes are so interconnected;
    signal means for rendering said first switch means conductive thereby connecting said memory cells to said power supply while said storage nodes are disconnected from each other causing a preselected bit of information determined by the cell impedances to be stored in said storage nodes and for rendering said first switch means nonconductive while said second switch means is rendered conductive to disconnect said power supply from said cell while said storage nodes are electrically connected to each other causing the information stored in said cell to be erased in response to the disconnecting of said cell from said power supply.

6. In a bistable memory cell according to claim 5, wherein said first switch means is a P channel device and said second switch means is an N channel device.

7. In a bistable memory cell according to claim 6, wherein said bistable memory cell is comprised of first and second field effect transistor inverter circuits, each inverter circuit being comprised of a P channel device and an N channel device, the P channel device of each of said inverter circuits being electrically connected to said first switch means, the N channel devices of each of said inverter circuits being connected to said second switch means.

8. A memory cell operable as a read only memory and a read/write memory comprising:
    first and second interconnected circuit means comprising a bistable circuit, said first circuit means having a first impedance determined by its structure and a first information storage node, said second circuit means having a second impedance determined by its structure and a second information storage node, said first and second impedances being different such that said bistable circuit is unbalanced,
    first means for connecting both of said circuit means to a power supply;
    second means connected to the information storage nodes of said first and second circuit means for discharging said nodes; and
    said first and second means being operable to discharge said nodes and set a preselected bit of information at said nodes determined by the relationship of said first and second impedances.

9. A memory cell according to claim 8 wherein said first means disconnects said power supply from said first and second circuit means and said second means interconnects said information nodes to reset both of said circuit means in response to a first signal, and said first means interconnects said power supply and said first and second circuit means and said second means disconnects said nodes in the absence of said first signal.

10. A memory cell according to claim 9 wherein said first and second means are transistors.

11. A memory cell according to claim 8 wherein said first and second circuit means each include field effect transistor inverters and said inverters are cross-coupled.

12. A memory cell according to claim 11 wherein said first means is a P channel device interconnecting the P channel devices of both inverters to said power supply and said second means is an N channel device interconnecting said nodes.

13. A memory cell according to claim 12 including signal means for providing a power-down signal, said power-down signal is applied to the gate of said first means to disconnect said memory cell from said power supply and to the gate of said second means to disconnect said nodes in response to the absence of a power-down signal.

14. In an integrated memory matrix having a plurality of bistable memory cells some of which are unbalanced, said unbalanced memory cells including a pair of cross-coupled transistor inverters, said inverters having unequal impedances such that upon application of power to said unbalanced cells they assume a predetermined one of two stable states determined by the impedance characteristics of the cell inverters, the improvement comprising:

first means interconnecting said unbalanced memory cells and a power supply;

second means connected to said unbalanced cells for discharging the information stored in said unbalanced cells; and signal means connected to said first and second means for controlling said first and second means to disconnect said unbalanced memory cells from said power supply and discharge said stored information in a first node and for controlling said first means to connect said memory cells and said power supply in a second node to cause said unbalanced cells to store a predetermined bit of information determined by the unbalance.

15. The integrated memory matrix according to claim 14 wherein said first and second storage means each include field effect transistor inverters and said inverters are cross-coupled.

16. The integrated memory matrix according to claim 15 wherein said first means is a P channel device interconnecting the P channel devices of both inverters to said power supply and said second means is an N channel device interconnecting said nodes.

17. The integrated memory matrix according to claim 16 wherein said signal means provides a power-down signal for said first mode and absence of said power-down signal for said second mode, said power-down signal is applied to the gate of said first means to disconnect said memory cell from said power supply and to the gate of said second means to interconnect said nodes.

* * * * *

UNITED STATES PATENT AND TRADEMARK OFFICE
CERTIFICATE OF CORRECTION

PATENT NO. : 4,149,268

DATED : Apr. 10, 1979

INVENTOR(S) : Ronald S. Waters

It is certified that error appears in the above-identified patent and that said Letters Patent are hereby corrected as shown below:

Column 1, line 14. Delete "are" and insert --is--.

line 26. Delete "having" and insert --have--.

line 39. Delete "unbalance" and insert --unbalanced--.

Column 2, lines 54-56. Change to read as follows, --verter which is cross-coupled to a second CMOS inverter formed by P channel and N channel devices 16 and 18. Interconnecting information storage --.

Column 3, line 14. Delete "switch" and insert --switches--.

line 37. Delete "causing" and insert --causes--.

line 38. Delete "removing" and insert --removes--.

line 43. Delete "duce" and insert --duces--.

line 46. Delete "function" second occurrence and insert --functions--.

line 61. Delete "A" and insert --An--.

Column 4, line 15. Delete "are" and insert --is--.

line 34. Overscore DATA, first occurence.

UNITED STATES PATENT AND TRADEMARK OFFICE
CERTIFICATE OF CORRECTION

PATENT NO. : 4,149,268
DATED : April 10, 1979
INVENTOR(S) : Ronald S. Waters

It is certified that error appears in the above-identified patent and that said Letters Patent are hereby corrected as shown below:

Column 4, line 35.  Overscore DATA, first occurence.
           line 44.  Delete "are" and insert --is--.
Column 5, line 4 .  Rewrite as follows:  --from switches 80 and 82, and 84 reenergizes cells 64--.
           line 27.  Delete "is" and insert --are--.
Column 8, line 28.  Delete "mode" and insert --node--.
           line 29.  Delete "mode" and insert --node--.

Signed and Sealed this

Thirty-first Day of July 1979

[SEAL]

Attest:

LUTRELLE F. PARKER
*Attesting Officer*   *Acting Commissioner of Patents and Trademarks*